(12) United States Patent
Callahan et al.

(10) Patent No.: US 7,663,125 B2
(45) Date of Patent: Feb. 16, 2010

(54) ION BEAM CURRENT UNIFORMITY MONITOR, ION IMPLANTER AND RELATED METHOD

(75) Inventors: William G. Callahan, Rockport, MA (US); Morgan D. Evans, Manchester, MA (US); George M. Gammel, Marblehead, MA (US); Norman E. Hussey, Middleton, MA (US); Gregg A. Norris, Rockport, MA (US); Joseph C. Olson, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 311 days.

(21) Appl. No.: 11/692,951

(22) Filed: Mar. 29, 2007

(65) Prior Publication Data

US 2008/0073584 A1 Mar. 27, 2008

Related U.S. Application Data

(60) Provisional application No. 60/812,193, filed on Jun. 9, 2006.

(51) Int. Cl.
*H01J 37/08* (2006.01)
*G21K 5/10* (2006.01)

(52) U.S. Cl. ............................ 250/492.21; 250/396 R; 250/398; 250/492.23; 250/492.3; 257/E21.043

(58) Field of Classification Search ............ 250/396 R, 250/397, 398, 492.21, 492.22, 492.23, 492.3; 257/E21.032, E21.043, E21.057
See application file for complete search history.

(56) References Cited

U.S. PATENT DOCUMENTS

| | | | |
|---|---|---|---|
| 4,628,209 A | 12/1986 | Wittkower | |
| 5,898,179 A * | 4/1999 | Smick et al. | 250/492.21 |
| 6,429,444 B1 * | 8/2002 | Korenev et al. | 250/492.3 |
| 6,617,596 B1 * | 9/2003 | Korenev | 250/492.3 |
| 6,791,094 B1 * | 9/2004 | Olson et al. | 250/397 |
| 6,872,953 B1 | 3/2005 | Benveniste | |
| 6,989,545 B1 * | 1/2006 | Rathmell et al. | 250/492.21 |
| 7,005,657 B1 | 2/2006 | Low et al. | |
| 7,078,707 B1 * | 7/2006 | Benveniste et al. | 250/491.1 |
| 7,462,844 B2 * | 12/2008 | Chang et al. | 250/492.21 |
| 7,473,911 B2 * | 1/2009 | Kadyshevitch et al. | 250/492.22 |
| 2003/0192474 A1 | 10/2003 | Smick et al. | |
| 2003/0227630 A1 * | 12/2003 | Roberts et al. | 356/445 |
| 2004/0058513 A1 | 3/2004 | Murrell et al. | |
| 2005/0191409 A1 * | 9/2005 | Murrell et al. | 427/8 |
| 2006/0006346 A1 * | 1/2006 | Rathmell et al. | 250/492.21 |
| 2006/0076510 A1 * | 4/2006 | Chang et al. | 250/492.21 |
| 2006/0145096 A1 * | 7/2006 | Benveniste et al. | 250/492.21 |
| 2006/0219936 A1 * | 10/2006 | Olson et al. | 250/397 |

(Continued)

FOREIGN PATENT DOCUMENTS

EP 0457321 A2 11/1991

(Continued)

*Primary Examiner*—Bernard E Souw

(57) ABSTRACT

An ion beam current uniformity monitor, ion implanter and related method are disclosed. In one embodiment, the ion beam current uniformity monitor includes an ion beam current measurer including a plurality of measuring devices for measuring a current of an ion beam at a plurality of locations; and a controller for maintaining ion beam current uniformity based on the ion beam current measurements by the ion beam current measurer.

18 Claims, 5 Drawing Sheets

U.S. PATENT DOCUMENTS

| | | | |
|---|---|---|---|
| 2006/0266957 A1* | 11/2006 | Chang et al. | 250/492.21 |
| 2007/0045569 A1* | 3/2007 | Walther et al. | 250/492.21 |
| 2007/0138388 A1* | 6/2007 | Ward et al. | 250/288 |
| 2008/0067433 A1* | 3/2008 | Weiguo et al. | 250/492.21 |
| 2008/0073584 A1* | 3/2008 | Callahan et al. | 250/492.21 |

FOREIGN PATENT DOCUMENTS

| | | |
|---|---|---|
| WO | 9802900 A1 | 1/1998 |
| WO | 02082496 A2 | 10/2002 |

\* cited by examiner

ION BEAM CURRENT UNIFORMITY MONITOR, ION IMPLANTER AND RELATED METHOD

This application claims the benefit of US Provisional Patent Application 60/812,193, filed Jun. 9, 2006.

FIELD OF THE INVENTION

This invention relates to systems and methods of ion implantation and, more particularly, to ion beam measurement.

BACKGROUND

Ion implantation is a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

An ion implanter usually includes an ion source for converting a gas or a solid material into a well-defined ion beam. The ion beam may be mass analyzed to eliminate undesired ion species, accelerated to a desired energy, and directed onto a target plane. The ion beam may be distributed over the target area by beam scanning, by target movement, or by a combination of beam scanning and target movement. The ion beam may be a spot beam or a ribbon beam, the latter of which includes a long dimension and a short dimension. The long dimension may be at least as wide as the wafer.

Introducing the impurities at a desired dose into a wafer is important to ensure that the semiconductor device being formed operates within specification. One factor that can affect the impurity dose into the wafer is the ion beam current distribution. Beam uniformity is required to provide a precise, uniform impurity dose. An unexpected fluctuation in ion beam current may degrade the uniformity of the impurity dose. If the ion beam is not uniform, it can lead to different concentrations of ions penetrating a wafer in different regions.

With advances in semiconductor manufacturing, there is an increased need for process information to, for example, provide process assurance or device modeling data. Thus, more accurate and complete measurements of beam properties, such as beam uniformity, may be required. More accurate and complete beam property measurements may also reduce process risk during implant through detection of a non-uniform beam.

When measuring ion beam uniformity at a user-specified interval, known as a "Uniformity Check Interval," a user often finds that uniformity is not within specification. Such intervals may be, for example, every hour or every 100 wafers. A "Uniformity Check Interval" does not provide feedback during implantation of a wafer.

Some single wafer implanters assume that if the beam was uniform during setup then uniformity is unchanged during wafer processing unless a uniform change in beam current across the entire beam occurs. Some scanned beam machines, ribbon beam machines, and spot beam single wafer machines may utilize this method because they rely on beam shape being unchanged to meet their uniformity specification at high throughput. This method also does not provide feedback on beam uniformity during implantation of a wafer.

Some single wafer implanters rely on current measurement of the beam across the entire wafer to test for beam uniformity during setup. Single point measurements or single numbers are typically relied upon during ion implantation to represent the beam. This generally only provides information as to whether the beam current has gone up or down during setup. Single point measurements do not check whether beam uniformity has been maintained.

Accordingly, there is a need in the art for new and improved methods and apparatus for improved monitoring of beam uniformity.

SUMMARY

An ion beam current uniformity monitor, ion implanter and related method are disclosed. In one embodiment, the ion beam current uniformity monitor includes an ion beam current measurer including a plurality of measuring devices for measuring a current of an ion beam at a plurality of locations; and a controller for maintaining ion beam current uniformity based on the ion beam current measurements by the ion beam current measurer.

A first aspect of the disclosure includes a method comprising: measuring an ion beam current prior to ion implanting at each of a plurality of locations within the ion beam; ion implanting at least one wafer; periodically measuring the ion beam current during ion implanting at each of the plurality of locations within the ion beam; and determining whether an ion beam current is non-uniform based on the ion beam current measurements.

A second aspect of the disclosure includes an ion beam current uniformity monitor comprising: an ion beam current measurer including a plurality of measuring devices for measuring a current of an ion beam at a plurality of locations; and a controller for maintaining ion beam current uniformity based on the ion beam current measurements by the ion beam current measurer.

A third aspect includes an ion implanter comprising: an ion source for generating an ion beam; a mass analyzer; an end station for holding a wafer to be implanted by the ion beam, the end station further including an ion beam current measurer including a plurality of measuring devices measuring a current of an ion beam at a plurality of locations; and a controller for determining a current uniformity of the ion beam based on measurements by the ion beam current measurer.

A fourth aspect of the disclosure includes a program product stored on a computer-readable medium, which when executed, monitors ion beam current uniformity, the program product comprising: program code for receiving an ion beam current measurement prior to ion implanting at each of a plurality of locations within the ion beam; program code for directing ion implanting at least one wafer; program code for receiving periodical measurements of the ion beam current during ion implanting at each of the plurality of locations within the ion beam; and program code for determining whether an ion beam current is non-uniform based on the ion beam current measurements.

BRIEF DESCRIPTION OF THE DRAWINGS

For a better understanding of the present invention, reference is made to the accompanying drawings, which are incorporated herein by reference and in which.

DETAILED DESCRIPTION

The invention is described herein in connection with an ion implanter. However, the invention can be used with other systems and processes that use beams of energetic charged particles. Thus, the invention is not limited to the specific embodiments described below.

Figure 1:
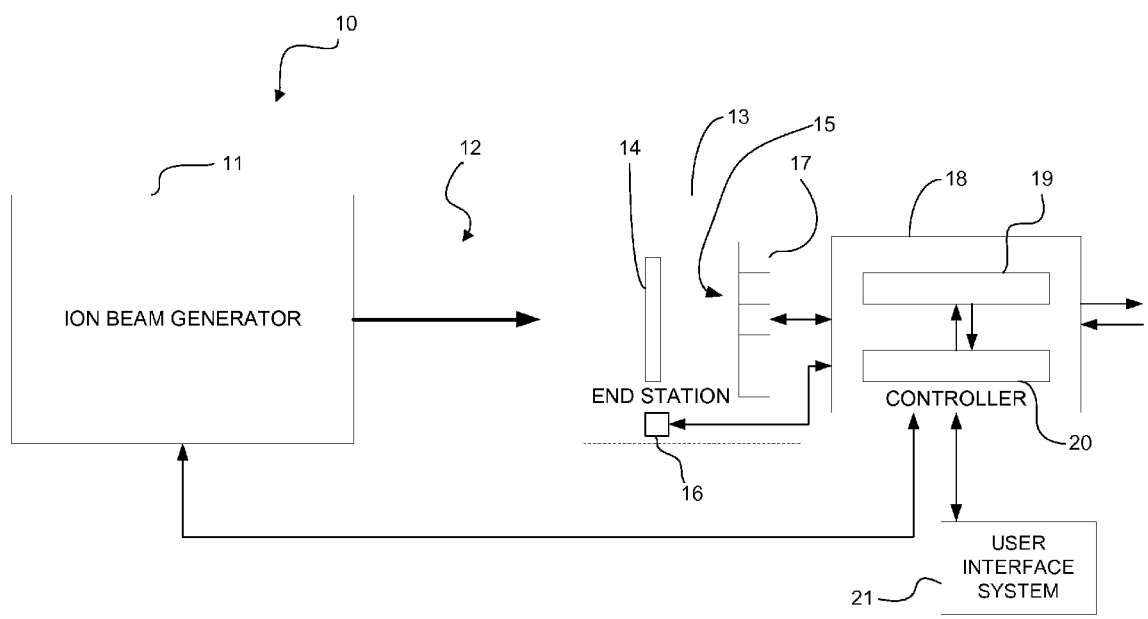
FIG. 1 is a simplified schematic diagram of one embodiment of an ion implanter suitable for implementing an ion beam current uniformity monitoring apparatus consistent with the embodiments of the invention.

A simplified schematic diagram of one embodiment of an ion implanter suitable for implementing is shown in FIG. 1. Ion implanter 10 includes ion beam generator 11. Ion beam generator 11 may include various types of components and systems to generate ion beam 12 having desired characteristics for implantation. Ion beam 12 may be a spot beam or a ribbon beam. The spot beam may be a fixed or stationary spot beam without a scanner. Alternatively, the spot beam may be scanned by a scanner of ion beam generator 11 for providing a scanned spot beam. The ribbon beam may have a large width/height aspect ratio. The ribbon ion beam may have a long dimension at least as wide as a workpiece or wafer to be implanted. Ion beam 12 may also be any type of charged particle beam, such as an energetic ion beam. Ion beam 12 implants a plurality of ions into wafer 14 within end station 13.

Monitor 15 may be located near wafer 14 within end station 13. Monitor 15 may include a plurality of measuring devices 17. Measuring devices 17 measure ion beam current uniformity and may, for example, be a plurality of Faraday cups or a multipixel dose array. Measuring devices 17 may also include or comprise other forms or types of measuring devices. Measuring devices 17 may be able to communicate with and be continuously and simultaneously monitored by controller 18. Controller 18 may be, for example, a dose controller for ion implanter 10 or multipixel electronics for ion implanter 10. Other forms of controller 18 may be used in ion implanter 10 and the two examples listed are not meant to be limiting.

Controller 18 may include a specific-purpose or general-purpose computer or network of general-purpose computers that may be programmed to perform the desired input/output functions. Controller 18 may include processor 19 and machine readable medium 20. Processor 19 may include one or more processors known in the art such as, for example, those commercially available from Intel Corporation. Machine readable medium 20 may include one or more machine readable storage media, such as random-access memory (RAM), dynamic RAM (DRAM), magnetic disk (e.g., floppy disk and hard drive), optical disk (e.g., CD-ROM), and/or any other device that can store instructions for execution. Controller 18 can also include other electronic circuitry or components, such as, but not limited to, application specific integrated circuits, other hardwired or programmable electronic devices, or discrete element circuits. Controller 18 may also include communication devices. Controller 18 may receive input data and instructions from any variety of systems and components of the ion implanter 10 and provide output signals to control the components of the ion implanter 10.

Ion implanter 10 may also include a user interface system 21. User interface system 21 may include, but not be limited to, devices such as touch screens, keyboards, user pointing devices, displays, or printers to allow a user to input commands and/or data and/or to monitor, for example, ion implanter 10, controller 18, or monitor 15.

Figure 2:
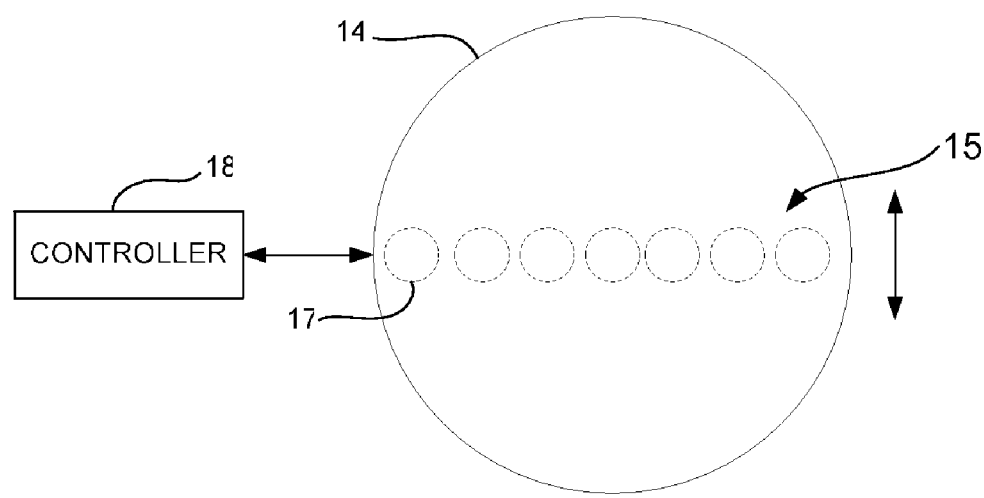
FIG. 2 is a simplified view of an embodiment of the ion beam current uniformity monitor in use.

FIG. 2 illustrates a simplified view of an embodiment of the ion beam current uniformity monitor in use. Seven measuring devices 17 are illustrated, however other numbers of measuring devices 17 are possible.

FIG. 2 is one example of how to test ion beam current uniformity. Before ion implantation of wafer 14 occurs, the setup values of ion beam (not illustrated) current ($F_{i\ setup}$) for some or all of measuring devices 17 in monitor 15 are recorded by controller 18 while beam setup is making its final uniformity measurements.

Once ion implantation begins, wafer 14 is located in front of measuring devices 17 of monitor 15 during the scan, as seen in FIG. 2. Wafer 14 will move, for example, in the direction of the arrows as ion implantation occurs. Monitor 15, at this time, may not provide measurements on ion beam current uniformity.

Figure 3:
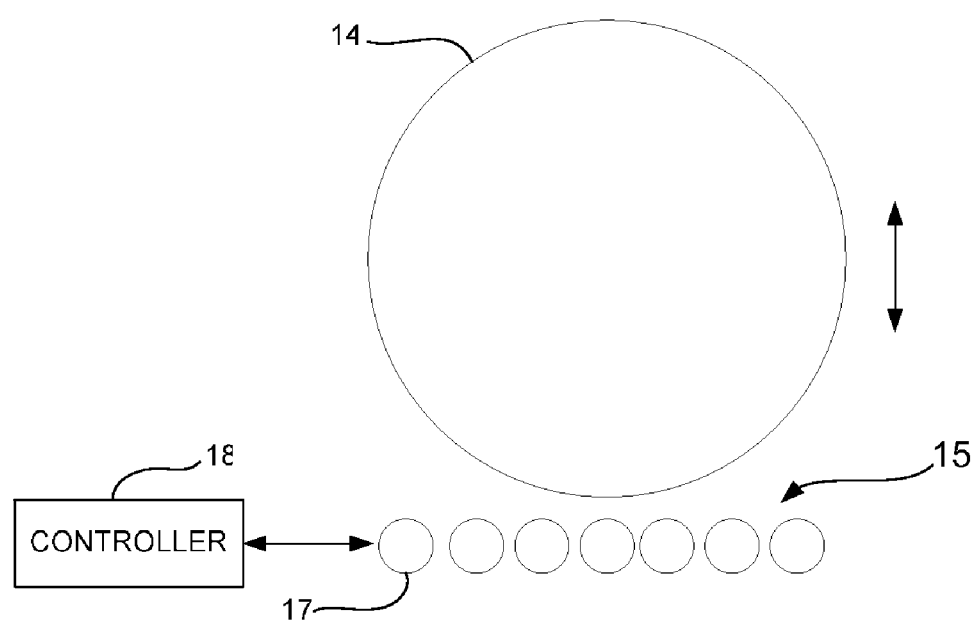
FIG. 3 is another simplified view of an embodiment of the ion beam current uniformity monitor in use.

FIG. 3 illustrates another simplified view of an embodiment of the ion beam current uniformity monitor in use. At an interval, controller 18 checks whether the values of ion beam (not illustrated) current for some or all measuring devices 17 in monitor 15 have changed. For example, this interval could be every time wafer 14 has completed the scan of ion beam, as illustrated in FIG. 3. This may be represented as $F_i$, for example. A ratio $F_i/F_{i\ setup}$ should be near one, in this example. However, other values of $F_i/F_{i\ setup}$ may be desired. In one example, the value of ion beam current may vary due to a beam glitch, in which all of the current dissipates on all of the measuring devices 17. After a beam glitch, monitor 15 may wait a period of time, e.g., to await re-establishment of beam current and uniformity stability, prior to re-measuring.

If any value of ion beam current for any of measuring devices 17 in monitor 15 has changed by more than a threshold amount, as examples, implantation maybe halted, corrective action taken, or some form of process control on the ion beam may be performed. The threshold amount may vary. With regard to the glitch problem described above, after waiting a period of time, monitor 15 re-measures uniformity. If the ratio $F_{i(glitch)}/F_{i\ setup}$ (i.e, current after glitch recovery versus current at start of implantation or setup) for one or more measuring devices 17 is above a threshold, it indicates that ion beam uniformity has not returned to the level required by monitor 15, and one or more of the actions listed above may be performed.

The same process control or uniformity check of the ion beam may be based, as other examples, on the trend of values of ion beam current for any of measuring devices 17 in monitor 15, or the differences between any set of values of ion beam current of individual measuring devices 17 in monitor 15. However, other examples of measurement and actions taken on those measurements are possible.

In another data measurement example, if each measuring device 17 is a Faraday cup, then the values of ion beam current processed in controller 18 are those recorded in each measuring device 17. Thus, the input to controller 18 may be the value of ion beam current of each cup. For example, this could be five or seven values to match five or seven cups.

In another data measurement example, however, if each measuring device 17 is part of a multipixel array, then the values of ion beam current of each column of pixels may be reduced to 5 or 7 values to match that of the number of Faraday cups in the previous example. The fraction of the ion beam that is targeting cup$_i$ would have been $F_i = I_i / I_{total}$, as an example. The measurement of a column of pixels must, in this example, equal $F_i$. Thus, the ion beam current uniformity measurements to controller 18 may not match the number of pixels in the multipixel array. Rather, the input to controller 18 may be, for example, five or seven values compiled from the columns of pixels. This matches the number of possible inputs if each measuring device 17 were a Faraday cup for software that may be used in controller 18. Other variations and embodiments related to compilation of values from measuring devices 17 are possible.

Referring back to FIG. 1, controller 18 may also be able to communicate with profiler 16. Profiler 16 measures the current of ion beam 12 and may be a Faraday cup or other measuring devices. Signals of ion beam current to controller 18 from monitor 15 may also be compared to the signals of ion beam current to controller 18 from profiler 16. Previous comparison of the change in signal of monitor 15 to the change in profiler 16 uniformity in the wafer plane have shown the signal of monitor 15 about four times more sensitive to changes in beam uniformity than the signal of profiler 16. This sensitivity is desirable so controller 18 may respond to changes in the beam as early as possible. Monitor 15 may also be used to detect other beam characteristics such as, for example, beam angle variation or energy contamination.

Measurements from monitor 15 may also be processed using statistical methods. For example, the Westinghouse rules may be applied in a process control context. These rules may dictate the response provided by controller 18. Other forms of statistical methods may be used on measurements from monitor 15.

Monitor 15 may provide process assurance so that the ion implanter 10 does not process wafer 14 when ion beam 12 does not meet the required uniformity. Monitor 15 may also be used as a diagnostic tool to identify situations when ion beam 12 is changing in uniformity by possibly determining the cause of the non-uniform ion beam and possibly eliminating that cause of the non-uniform ion beam through process control. In addition, monitor 15 may be used for process optimization during wafer processing. Monitor 15 may further be used to increase productivity by reducing or eliminating need for the "Uniformity Check Interval" that usually occurs after a fixed number of minutes or after a fixed number of wafers have been processed. Monitor 15 may also proactively determine when to re-setup beam uniformity without slowing down throughput.

Figure 4:
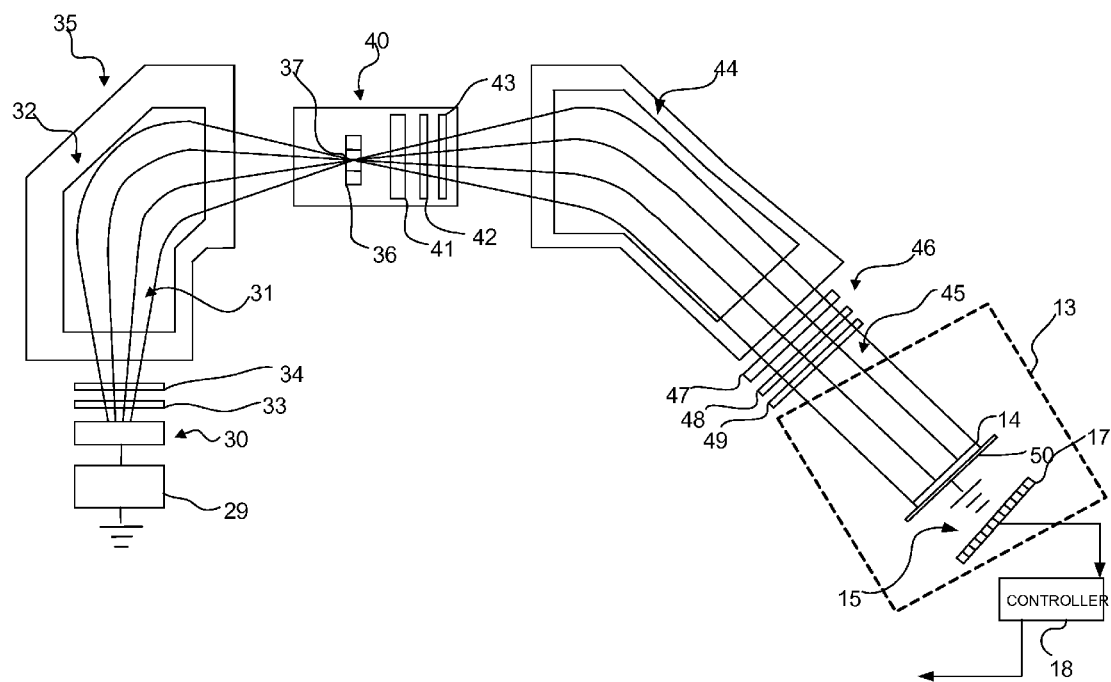
FIG. 4 is a simplified schematic diagram of an embodiment of the monitoring apparatus of FIG. 1 in a ribbon beam ion implanter.

A schematic diagram of one embodiment of one possible type of ion implanter suitable for implementing the monitoring apparatus of FIG. 1 is shown in FIG. 4. Those skilled in the art will recognize other ion implanters that may also be utilized to implement the present disclosure. In general, the ion implanter includes ion source 30 to generate ions and supply ion beam 31. Ion source 30 may include an ion chamber and a gas box containing a gas to be ionized. The gas is supplied to the ion chamber where it is ionized. The ions thus formed are extracted from the ion chamber to form ion beam 31. Ion beam 31 may be directed between the poles of resolving magnet 32. A first power supply 29 may be connected to an extraction electrode of ion source 30 and provide a positive first voltage $V_0$. First voltage $V_0$ may be adjustable, for example, from about 0.2 to about 80 kV. Thus, ions from ion source 10 are accelerated to energies of about 0.2 to about 80 keV by the first voltage $V_0$.

Ion beam 31 passes through suppression electrode 33 and ground electrode 34 to mass analyzer 35. Mass analyzer 35 includes resolving magnet 32 and masking electrode 36 having resolving aperture 37. Resolving magnet 32 deflects ions in ion beam 31 such that ions of a desired ion species pass through resolving aperture 37. Undesired ion species do not pass through resolving aperture 37, but are blocked by masking electrode 36. In one embodiment, resolving magnet 32 deflects ions of the desired species by 90°.

Ions of the desired ion species pass through resolving aperture 37 to a first deceleration stage 40 positioned downstream of mass analyzer 35. Deceleration stage 40 may include upstream electrode 41, suppression electrode 42, and downstream electrode 43. Ions in ion beam 31 may be decelerated by deceleration stage 40 and then may pass through angle corrector magnet 44. Angle corrector magnet 44 deflects ions of the desired ion species and converts the ion beam from a diverging ion beam to ribbon ion beam 45, which has substantially parallel ion trajectories. In one embodiment, angle corrector magnet 44 deflects ions of the desired ion species by 70°.

End station 13 supports one or more semiconductor wafers, such as wafer 14, in the path of ribbon ion beam 45 such that ions of the desired species are implanted into wafer 14. End station 13 may include platen 50 to support wafer 14. End station 13 may also include a scanner (not shown) for moving wafer 14 perpendicular to the long dimension of the ribbon ion beam 45 cross-section, thereby distributing ions over the entire surface of wafer 14. Ribbon ion beam 45 may be at least as wide as wafer 14. Although ribbon ion beam 45 is illustrated, other ion implanter embodiments may provide a scanned ion beam (scanned in one or two dimensions) or may provide a fixed ion beam. The ion implanter may include a second deceleration stage 46 positioned downstream of angle corrector magnet 44. Deceleration stage 46 may include upstream electrode 47, suppression electrode 48, and downstream electrode 49.

The ion implanter may include additional components known to those skilled in the art. For example, end station 13 typically includes automated wafer handling equipment for introducing wafers into the ion implanter and for removing wafers after ion implantation. End station 13 may also include a dose measuring system, an electron flood gun, and other known components. It will be understood that the entire path traversed by the ion beam is evacuated during ion implantation.

End station 13 may also include monitor 15 for continuous beam uniformity measurement. Monitor 15 may include a plurality of measuring devices 17 within end station 13. Measuring devices 17 of monitor 15 are able to communicate with controller 18. Controller 18 may be capable of checking more than one measuring device simultaneously and may include software to detect relative change in the ion current distribution of ribbon ion beam 45 in all measuring devices 17 being checked. It may also provide feedback based on the distribution of ribbon ion beam 45.

Figure 5:
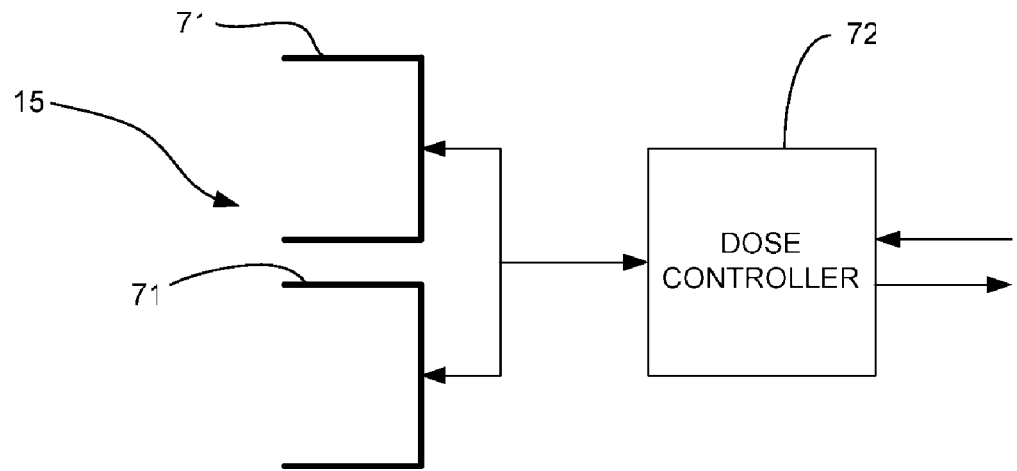
FIG. 5 is a view of an embodiment of the monitoring apparatus of FIG. 1 utilizing Faraday cups.

An embodiment of the monitoring apparatus of FIG. 1 utilizing Faraday cups is shown in FIG. 5. Monitor 15 is a plurality of Faraday cups 71 that may be able to communicate with the controller, which is, in this case, dose controller 72. In this instance, two Faraday cups 71 are illustrated, but other numbers and arrangements of Faraday cups 71 are possible.

In this embodiment, dose controller 72 can read two channels simultaneously during medium current ion implantation.

Figure 6:
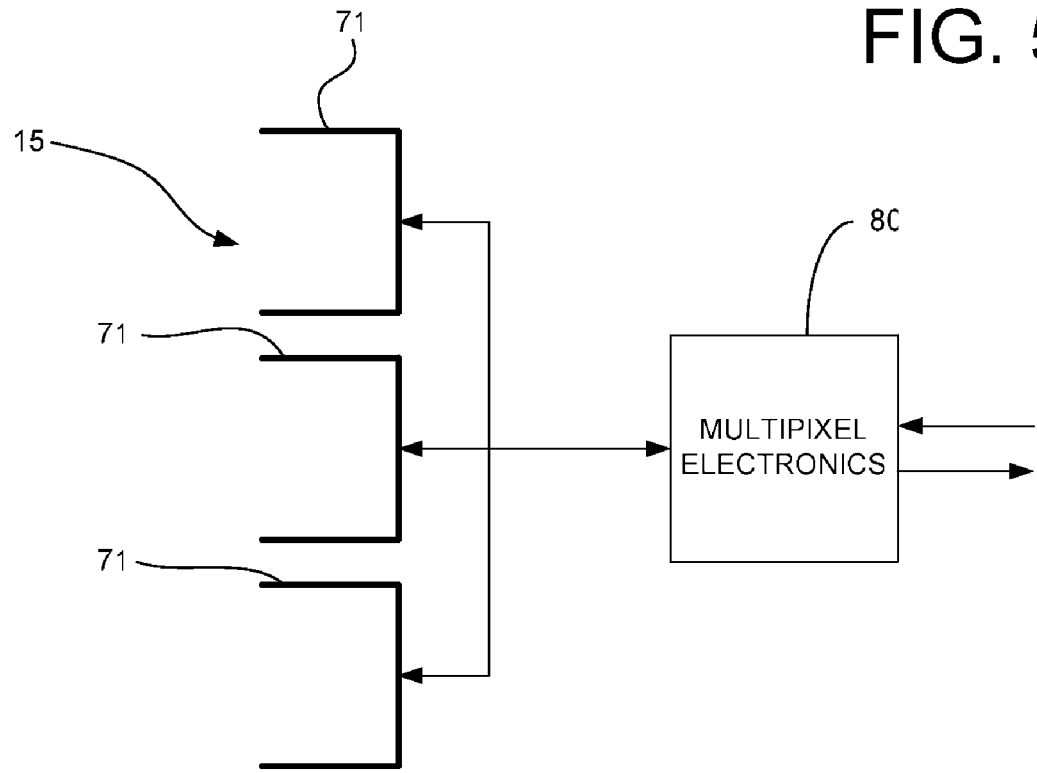
FIG. 6 is view of another embodiment of the monitoring apparatus of FIG. 1 utilizing Faraday cups.

Another embodiment of the monitoring apparatus of FIG. 1 utilizing Faraday cups is shown in FIG. 6. Monitor 15 is a plurality of Faraday cups 71 that may be able to communicate with the controller, which is, in this case, multipixel electronics 80. In the current embodiment, during high current ion implantation, multipixel electronics 80 can read up to seventy-two cups simultaneously. Only three Faraday cups 71 have been illustrated in this figure. Other numbers and arrangements of Faraday cups 71 are possible.

Figure 7:
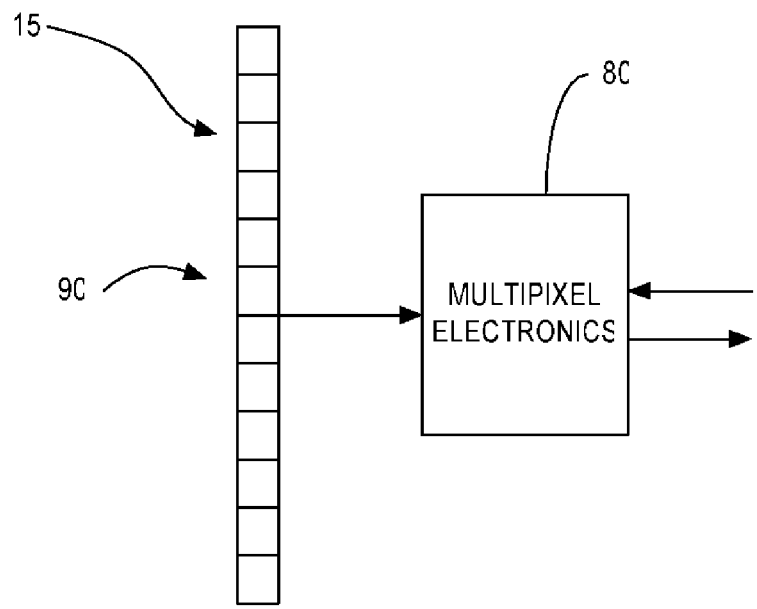
FIG. 7 is view of another embodiment of the monitoring apparatus of FIG. 1 utilizing a multipixel dose array.

Another embodiment of the monitoring apparatus of FIG. 1 utilizing a multipixel dose array is shown in FIG. 7. Monitor 15 is multipixel dose array 90. Multipixel dose array 90 may be able to communicate with the controller, which is, in this case, multipixel electronics 80.

Figure 8:
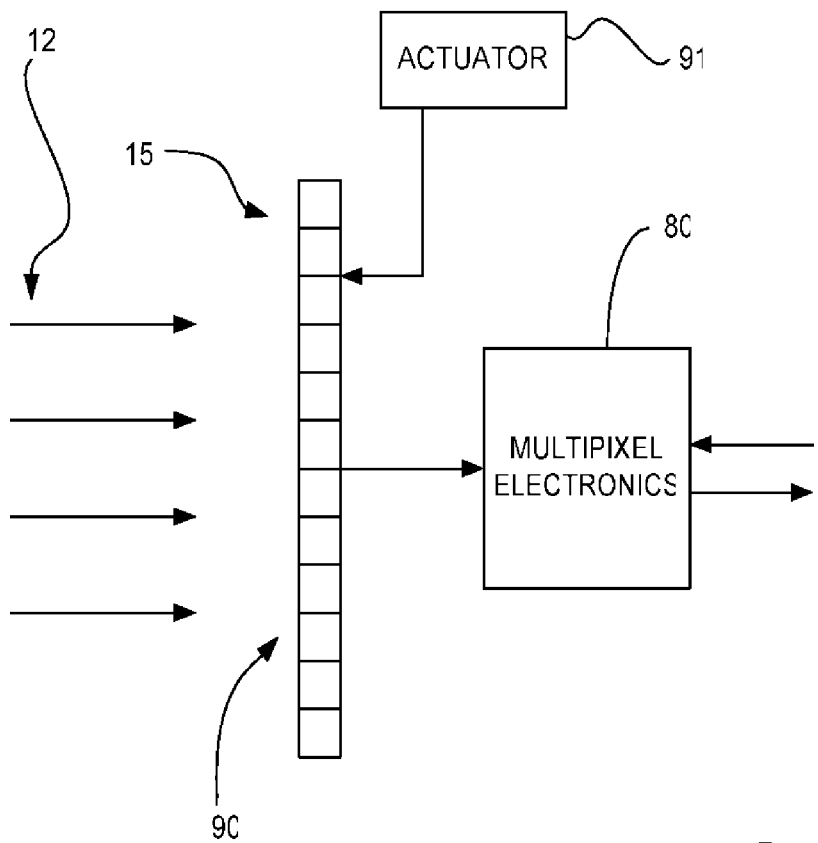
FIG. 8 is a view of another embodiment of the monitoring apparatus of FIG. 1 utilizing a monitor actuator.

Another embodiment of the monitoring apparatus of FIG. 1 utilizing a monitor actuator is illustrated in FIG. 8. In this embodiment, monitor 15 is multipixel dose array 90, which may be able to communicate with the controller, which is, in this case, multipixel electronics 80. Actuator 91 may drive measuring devices 17 in a particular direction. Actuator 91 may also move multipixel dose array 90 in and out of the path of ion beam 12. This may be, for example, in the x, y, or z direction in relation to the ion beam or the wafer. Other measuring devices may be likewise be driven by actuator 91.

Controller 18 includes software enabled to carry out the above-described embodiments. For example, controller 18 may include program code for receiving an ion beam current measurement prior to ion implanting at each of a plurality of locations within the ion beam; program code for directing ion implanting at least one wafer; program code for receiving periodical measurements of the ion beam current during ion implanting at each of the plurality of locations within the ion beam; and program code for determining whether an ion beam current is non-uniform based on the ion beam current measurements.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not intended as limiting. What is claimed is any feature detailed herein.

What is claimed is:

1. A method comprising:
  measuring an ion beam current at each of a plurality of locations within an ion beam prior to ion implanting;
  scanning the ion beam relative to at least one wafer to ion implant the at least one wafer;
  measuring the ion beam current at each of the plurality of locations within the ion beam after the scanning; and
  determining whether the ion beam current is non-uniform based on the ion beam current measurements.

2. The method of claim 1, further comprising determining a distribution of the ion beam current across the plurality of locations.

3. The method of claim 2, further comprising correcting a current non-uniformity in the case that the ion beam current distribution changes by greater than a threshold.

4. The method of claim 2, wherein the distribution determining includes simultaneously measuring the ion beam at a plurality of positions within the ion beam in the case that the ion beam includes a ribbon ion beam.

5. The method of claim 2, wherein the distribution determining includes measuring the ion beam at a plurality of locations to which the ion beam is scanned in the case that the ion beam includes a spot ion beam.

6. The method of claim 1, further comprising correcting for a current non-uniformity in the case that the ion beam current changes by greater than a threshold of at least one of the plurality of locations.

7. The method of claim 6, wherein the at least one of the plurality of locations includes a set of locations.

8. The method of claim 1, further comprising correcting for a current non-uniformity in the case that a trend of the ion beam current changes by greater than a threshold of at least one of the plurality of locations.

9. The method of claim 1, wherein the measuring the ion beam current after the scanning and the non-uniformity determining occur after each wafer is ion implanted.

10. The method of claim 1, wherein in the case that the measuring the ion beam current after the scanning occurs after an ion beam glitch, further comprising waiting a period of time prior to the next measuring of the ion beam current.

11. The method of claim 1, wherein the measuring an ion beam current prior to ion implanting and the measuring the ion beam current after the scanning includes using a plurality of measuring devices.

12. The method of claim 11, wherein the plurality of measuring devices includes a plurality of Faraday cups.

13. The method of claim 11, wherein the plurality of measuring devices includes a multipixel dose array.

14. The method of claim 13, wherein the measuring an ion beam current prior to ion implanting and the measuring the ion beam current after the scanning includes using a portion of the mutipixel dose array.

15. The method of claim 1, wherein the non-uniformity determining includes comparing values of the plurality of locations to those of a dose uniformity profiler.

16. The method of claim 1, further comprising determining at least one of:
  ion beam angle variation and energy contamination based on the measuring the ion beam current after the scanning.

17. The method of claim 1, further comprising statistically analyzing the measurements obtained from the measuring the ion beam current after the scanning.

18. The method of claim 1, wherein the determining comprises determining uniformity of the ion beam current during the scanning the ion beam relative to at least one wafer.

* * * * *